:::
United States Patent
Wu et al.

(10) Patent No.: US 9,312,884 B2
(45) Date of Patent: Apr. 12, 2016

(54) DOUBLE QC-LDPC CODE

(71) Applicant: NATIONAL TSING HUA UNIVERSITY, Hsinchu (TW)

(72) Inventors: Jen-Ming Wu, Hsinchu (TW); Sheng-Han Wu, Kaohsiung (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 308 days.

(21) Appl. No.: 13/934,213

(22) Filed: Jul. 2, 2013

(65) Prior Publication Data
US 2014/0298132 A1     Oct. 2, 2014

(30) Foreign Application Priority Data

Mar. 27, 2013  (TW) .............................. 102110934 A

(51) Int. Cl.
*H03M 13/00*    (2006.01)
*H03M 13/11*    (2006.01)

(52) U.S. Cl.
CPC ........ *H03M 13/1108* (2013.01); *H03M 13/116* (2013.01); *H03M 13/118* (2013.01); *H03M 13/611* (2013.01); *H03M 13/6502* (2013.01)

(58) Field of Classification Search
CPC .. H03M 13/09; H03M 13/091; H04L 1/0061; H04L 1/0057; H04L 1/0045
USPC ......................................................... 714/758
See application file for complete search history.

(56) References Cited

U.S. PATENT DOCUMENTS

| | | | |
|---|---|---|---|
| 2008/0052594 A1* | 2/2008 | Yedidia ............. | H03M 13/1105 714/758 |
| 2011/0161770 A1* | 6/2011 | Ueng et al. .................... | 714/752 |
| 2011/0179333 A1* | 7/2011 | Wesel ............... | H03M 13/1111 714/752 |

* cited by examiner

*Primary Examiner* — Esaw Abraham
*Assistant Examiner* — Enam Ahmed
(74) *Attorney, Agent, or Firm* — CKC & Partners Co., Ltd.

(57) ABSTRACT

A double quasi-cyclic low density parity check (DQC-LDPC) code and a corresponding processor are disclosed herein. The parity-check matrix of DQC-LDPC codes has regularity with its corresponding processor including an input end, an output end and a processing module. The parity-check matrix includes a double quasi-cyclic matrix. The double quasi-cyclic matrix includes a plurality of sub-matrices. The sub-matrices are arranged in an array. Each sub-matrix includes a plurality of entries, and each sub-matrix is a circulant matrix having the entries circular shifted row-by-row. The double quasi-cyclic matrix is a circulant matrix having the sub-matrices circular shifted row-by-row. The processing module is configured to process an input signal and output an output signal correspond to the parity-check matrix of a low density parity check code (LDPC).

14 Claims, 8 Drawing Sheets

$$Q_p = \begin{bmatrix} e_0(p) & e_1(p) & e_2(p) & \cdots & e_{q-2}(p) & e_{q-1}(p) \\ e_1(p) & e_2(p) & e_3(p) & \cdots & e_{q-1}(p) & e_0(p) \\ e_2(p) & e_3(p) & e_4(p) & \cdots & e_0(p) & e_1(p) \\ \vdots & \vdots & \vdots & & \vdots & \vdots \\ e_{q-1}(p) & e_0(p) & e_1(p) & \cdots & e_{q-3}(p) & e_{q-2}(p) \end{bmatrix}$$

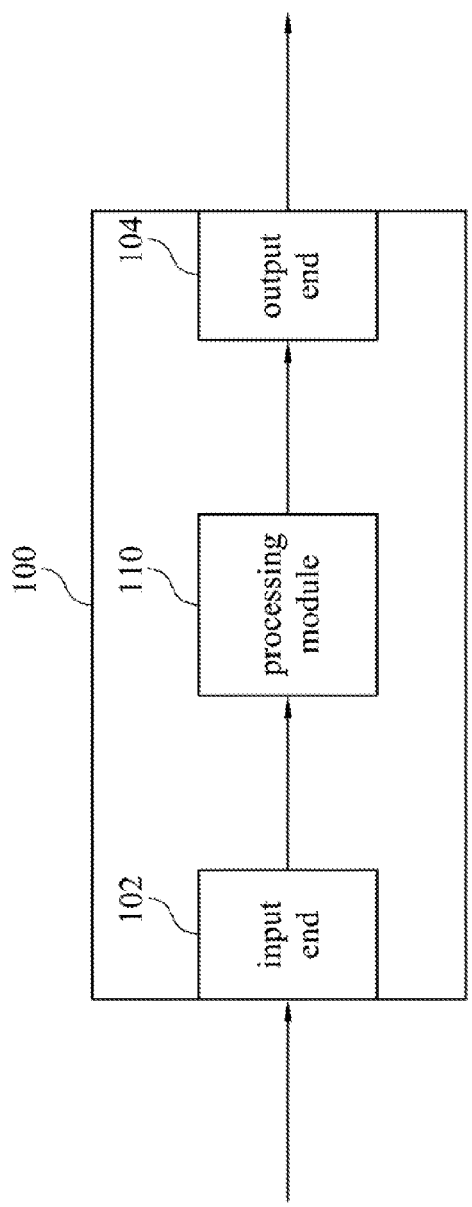

$$DQC = \begin{pmatrix} Q_{m-1} & Q_{m-2} & Q_{m-3} & \cdots & Q_0 \\ Q_{m-2} & Q_{m-3} & Q_{m-4} & \cdots & Q_{m-1} \\ \vdots & \vdots & \vdots & & \vdots \\ Q_2 & Q_1 & Q_0 & \cdots & Q_3 \\ Q_1 & Q_0 & Q_{m-1} & \cdots & Q_2 \\ Q_0 & Q_{m-1} & Q_{m-2} & \cdots & Q_1 \end{pmatrix}$$

Fig. 3

$$DQC = \begin{pmatrix} Q_{m-1} & Q_0 & Q_1 & \cdots & Q_{m-2} \\ Q_{m-2} & Q_{m-1} & Q_0 & \cdots & Q_{m-3} \\ \vdots & \vdots & \vdots & & \vdots \\ Q_2 & Q_3 & Q_4 & \cdots & Q_1 \\ Q_1 & Q_2 & Q_3 & \cdots & Q_0 \\ Q_0 & Q_1 & Q_2 & \cdots & Q_{m-1} \end{pmatrix}$$

Fig. 4

$$Q_p = \begin{pmatrix} e_0(p) & e_1(p) & e_2(p) & \cdots & e_{q-1}(p) \\ e_{q-1}(p) & e_0(p) & e_{q-1}(p) & \cdots & e_{q-2}(p) \\ e_{q-2}(p) & e_{q-1}(p) & e_0(p) & \cdots & e_{q-3}(p) \\ \vdots & \vdots & \vdots & \ddots & \vdots \\ e_1(p) & e_2(p) & e_3(p) & \cdots & e_0(p) \end{pmatrix}$$

Fig. 5

$$Q_p = \begin{pmatrix} e_0(p) & e_1(p) & e_2(p) & \cdots & e_{q-1}(p) \\ e_1(p) & e_2(p) & e_3(p) & \cdots & e_0(p) \\ e_2(p) & e_3(p) & e_4(p) & \cdots & e_1(p) \\ \vdots & \vdots & \vdots & \ddots & \vdots \\ e_{q-1}(p) & e_0(p) & e_1(p) & \cdots & e_{q-2}(p) \end{pmatrix}$$

DOUBLE QC-LDPC CODE

RELATED APPLICATIONS

This application claims priority to Taiwan Application Serial Number 102110934, filed Mar. 27, 2013, which is herein incorporated by reference.

BACKGROUND

1. Technical Field

The present disclosure relates to a communication code and a corresponding electronic component. More particularly, the present invention relates to a double quasi-cyclic low density parity check (DQC-LDPC) code and a corresponding processor.

2. Description of Related Art

With advances in communication coding technology, error correcting codes have been widely used in various data communication technologies, such as digital video broadcasting (DVB) systems, digital televisions (DTVs), digital set top boxes (STBs), tablet computers, smart phones, and NAND flash memories.

With respect to error correcting codes, the error correction capability of the low-density parity check (LDPC) code is better than the error correction capabilities of the Bose-Chaudhuri-Hocquenghem code (BCH code), the Reed-Solomon code (R-S code), and the convolutional code in a low signal-to-noise (SNR) channel.

Generally, the error correction capability of an LDPC code is decided by the arrangement of value "0" and value "1" in the parity-check matrix. A typical parity-check matrix of an LDPC code used today is designed with a random arrangement of value "0" and value "1." However, the encoder/decoder of such an LDPC code is complex and therefore difficult to realize.

Thus, a parity-check matrix of an LDPC code with a higher regularity is desired.

SUMMARY

One aspect of the present invention is directed to a processor corresponding to a double quasi-cyclic low density parity check (DQC-LDPC) code. In accordance with one embodiment of the present invention, the processor includes an input end, an output end, and a processing module. The input end is configured to receive an input signal. The output end is configured to output an output signal. The processing module is configured to process the input signal to generate the output signal corresponding to a parity-check matrix of the DQC-LDPC code. The parity-check matrix includes a double quasi-cyclic (DQC) matrix. The double quasi-cyclic matrix includes a plurality of sub-matrices. The sub-matrices are arranged in an array. Each sub-matrix includes a plurality of entries. Each sub-matrix is a circulant matrix having the entries circular shifted row-by-row. The double quasi-cyclic matrix is a circulant matrix having the sub-matrices circular shifted row-by-row.

In accordance with one embodiment of the present invention, the sub-matrices are right circulant matrices having the sub-matrices circular right shifted row-by-row.

In accordance with one embodiment of the present invention, the sub-matrices are left circulant matrix having the sub-matrices circular left shifted row-by-row.

In accordance with one embodiment of the present invention, the parity-check matrix has n×q columns of the entries and m×q rows of the entries. The double quasi-cyclic matrix has m columns of sub-matrices and m rows of sub-matrices. Each of the sub-matrices has q columns of the entries and q rows of the entries. The double quasi-cyclic matrix is presented as DQC in an equation below, and the entries in the double quasi-cyclic matrix are conformed to the equation:

$$DQC[((i\pm x) \bmod m) \times q + ((j\pm y) \bmod q)][x \times q + y] = DQC[i \times q + j][0],$$

where i, j, x, y are integers, $0 \le i < m$, $0 \le j < q$, $0 \le x < m$, and $0 \le y < q$. The operator "mod" is the function that calculates the remainder originated from quotient divided by the divider.

In accordance with one embodiment of the present invention, the double quasi-cyclic matrix corresponds to the output signal or to a plurality of parity bits of the output signal.

In accordance with one embodiment of the present invention, the double quasi-cyclic matrix is a square matrix.

In accordance with one embodiment of the present invention, column-weights of columns of the entries in the double quasi-cyclic matrix are equal to each other. Row-weights of rows of the entries in the double quasi-cyclic matrix are equal to each other. The row-weight is defined as the number of ones in a row. The column-weights of the columns of the entries in the double quasi-cyclic matrix are equal to the row-weights of the rows of the entries in the double quasi-cyclic matrix. The column-weight is defined as the number of ones in a column.

In accordance with one embodiment of the present invention, the input signal is a message. The processing module is configured to encode the input signal to output a low density parity check (LDPC) codeword serving as the output signal.

In accordance with one embodiment of the present invention, the processing module includes a cyclic outer circuit and an XOR gate array. The to cyclic outer circuit includes a plurality of cyclic inner circuits and a plurality of second multiplexers. Each cyclic inner circuit includes a plurality of shift registers and a plurality of first multiplexers. The shift registers are configured to receive a clock signal and store information. The plurality of first multiplexers are configured to receive a shift-enable signal and to quasi-cycle the information stored in the shift registers according to the shift-enable signal. The second multiplexers are configured to receive an initial signal, and to block quasi-cycle the information stored in the shift registers and to output the information stored in the shift registers of the cyclic inner circuits according to the initial signal. The XOR gate array includes a plurality of XOR gates. The XOR gates are disposed corresponding to an inverse matrix of the double quasi-cyclic matrix. The XOR gate array is configured to receive the information outputted from the second multiplexers, and to output a plurality of parity bits of the LDPC codeword according to the information outputted from the second multiplexers and the inverse matrix of the double quasi-cyclic matrix.

In accordance with one embodiment of the present invention, after the parity-check matrix is row interchanged, the output signal generated by the processing module is essentially the same as the output signal before the parity-check matrix is row interchanged.

In accordance with one embodiment of the present invention, each of the second multiplexers includes a first input end, a second input end, a control end, and an output end. The first input end of each of the second multiplexers is electrically connected to a corresponding cyclic inner circuit of the cyclic inner circuits. The output end of each of the second multiplexers is electrically to connected to the XOR gate array and another corresponding cyclic inner circuit of the cyclic inner circuits. The control end of each of the second multiplexers is configured to receive the initial signal.

In accordance with one embodiment of the present invention, the second input ends of the second multiplexers are configured to receive a syndrome vector.

In accordance with one embodiment of the present invention, the input signal is an LDPC codeword. The processing module is configured to decode the input signal to output a decoded message serving as the output signal.

In accordance with one embodiment of the present invention, the entries inside each of the sub-matrices are right circulant matrices having the entries right shifted row-by-row.

In accordance with one embodiment of the present invention, the entries inside each of the sub-matrices are left circulant matrices having the entries left shifted row-by-row.

Thus, through application of one of the embodiments mentioned above, a parity-check matrix of an LDPC code with a higher regularity can be realized.

BRIEF DESCRIPTION OF THE DRAWINGS

The invention can be more fully understood by reading the following detailed description of the embodiment, with reference made to the accompanying drawings as follows:

FIG. 1 is a schematic diagram of a processor corresponding to a double quasi-cyclic low density parity check (DQC-LDPC) code in accordance with one embodiment of the present disclosure;

FIG. 2 is a diagram illustrating a parity-check matrix in accordance with one embodiment of the present disclosure;

FIG. 3 is a diagram illustrating a double quasi-cyclic (DQC) matrix in accordance with one embodiment of the present disclosure;

FIG. 4 is a diagram illustrating another double quasi-cyclic matrix in accordance with another embodiment of the present disclosure;

FIG. 5 is a diagram illustrating a sub-matrix of the double quasi-cyclic matrix in accordance with one embodiment of the present disclosure;

FIG. 6 is a diagram illustrating another sub-matrix of the double quasi-cyclic matrix in accordance with another embodiment of the present disclosure;

FIG. 10 is a diagram illustrating three parity-check matrices in accordance with one embodiment of the present disclosure.

DETAILED DESCRIPTION

Figure 7:
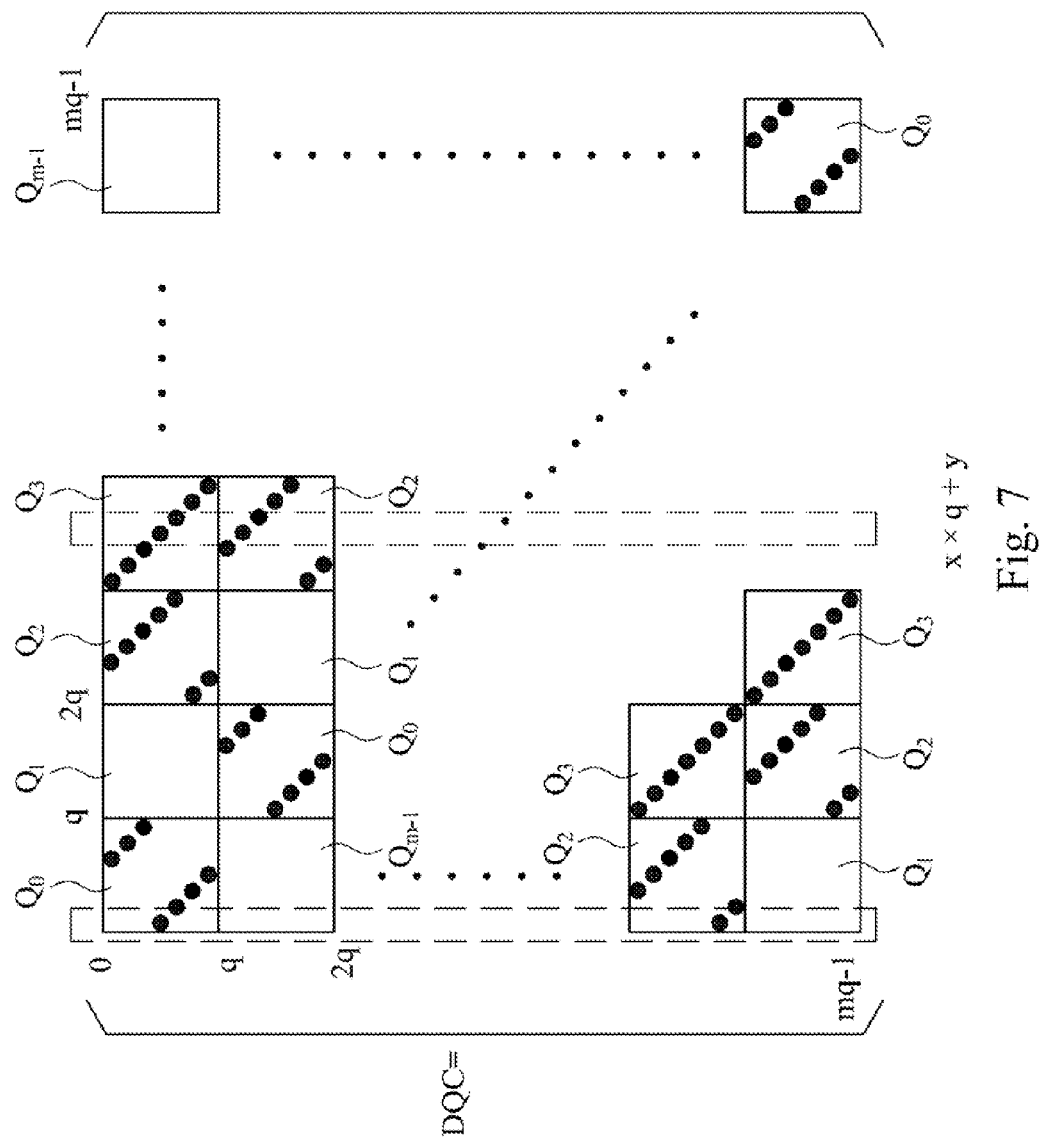
FIG. 7 is a diagram illustrating the double quasi-cyclic matrix in accordance with still another embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram of a processor 100 corresponding to a double quasi-cyclic low density parity check (DQC-LDPC) code in accordance with one embodiment of the present disclosure. The processor 100 includes an input end 102, an output end 104, and a processing module 110. The input end 102 is configured to receive an input signal (e.g., a codeword or a message). The output end 104 is configured to output an output signal (e.g., a message or a codeword). The processing module 110 is configured to process the input signal to generate the output signal corresponding to a parity-check matrix H of the DQC-LDPC code.

FIG. 2 is a diagram illustrating the parity-check matrix H in accordance with one embodiment of the present disclosure. The parity-check matrix H includes a plurality of sub-matrices $P_{0,0}$-$P_{m-1,n-1}$ (e.g., m×n sub-matrices) arranged in an array. Each of the sub-matrices $P_{0,0}$~$P_{m-1,n-1}$ is a square matrix and includes a plurality of entries (e.g., q×q entries). The parity-check matrix H includes a double quasi-cyclic matrix DQC, which can be composed by a plurality of sub-matrices $P_{0,x}$-$P_{m-1,x+m-1}$ in the sub-matrices $P_{0,0}$-$P_{m-1,n-1}$. The double quasi-cyclic matrix DQC is a circulant matrix having the sub-matrices $P_{0,x}$-$P_{m-1,x+m-1}$ circular shifted row-by-row. Each of the sub-matrices $P_{0,x}$-$P_{m-1,x+m-1}$ in the double quasi-cyclic matrix DQC is a circulant matrix having the entries circular shifted row-by-row. It should be noted that the double quasi-cyclic matrix DQC can start at any column of the parity-check matrix H.

To better explain the circulant matrix mentioned above, reference will now be made to FIGS. 3-6.

In accordance with one embodiment in FIG. 3, the double quasi-cyclic matrix DQC, for example, is a right (or down) circulant matrix. The sub-matrices (e.g., sub-matrices $Q_0, Q_1, \ldots, Q_{m-1}$ shown in FIG. 3) in the double quasi-cyclic matrix DQC are right circular shifted row-by-row. In other words, a specific row of the sub-matrices (e.g., $[Q_0, Q_1, Q_2, \ldots, Q_{m-1}]$) in the double quasi-cyclic matrix DQC can be obtained by performing a left circular shift to the immediate next row of the sub-matrices (e.g., $[Q_{m-1}, Q_0, Q_1 \ldots, Q_{m-2}]$). For example, the $0^{th}$ row of the sub-matrices $[Q_0, Q_1, Q_2, \ldots, Q_{m-1}]$ can be obtained by performing a left circular shift to the $1^{st}$ row of the sub-matrices $[Q_{m-1}, Q_0, Q_1, \ldots, Q_{m-2}]$, and the $1^{st}$ row of the sub-matrices $[Q_{m-1}, Q_0, Q_1, \ldots, Q_{m-2}]$ can be obtained by performing a left circular shift to the $2^{nd}$ row of the sub-matrices $[Q_{m-2}, Q_{m-1}, Q_0, \ldots, Q_{m-3}]$. In another aspect, the sub-matrices $Q_0, Q_1, \ldots, Q_{m-1}$ in the double quasi-cyclic matrix DQC are down circular shifted column-by-column.

In accordance with another embodiment in FIG. 4, the double quasi-cyclic matrix DQC, for example, is a left (or up) circulant matrix. The sub-matrices $Q_0, Q_1, \ldots, Q_{m-1}$ in the double quasi-cyclic matrix DQC are left circular shifted row-by-row. In another aspect, the sub-matrices $Q_0, Q_1, \ldots, Q_{m-1}$ in the double quasi-cyclic matrix DQC are up circular shifted column-by-column.

In accordance with one embodiment in FIG. 5, a sub-matrix $Q_p$ (0≤p<m-1, and p is an integer) in FIG. 3 or FIG. 4, for example, is a right (or down) circulant matrix. The sub-matrix $Q_p$ includes a plurality of entries (e.g., entries $e_0(p)$-$e_{q-1}(p)$), in which the entries $e_0(p)$-$e_{q-1}(p)$ can be value "1" or value "0." The entries $e_0(p)$-$e_{q-1}(p)$ in the sub-matrix $Q_p$ are right circular shifted row-by-row. In other words, a specific row of the entries (e.g., $[e_0(p), e_1(p), e_2(p), \ldots, e_{q-1}(p)]$) in the double quasi-cyclic matrix DQC can be obtained by performing a left circular shift to the immediate next row of the entries (e.g., $[e_{q-1}(p), e_0(p), e_1(p), \ldots, e_{q-2}(p)]$). For example, the $0^{th}$ row of the entries $[e_0(p), e_1(p), e_2(p), \ldots, e_{q-1}(p)]$ can be obtained by performing a left circular shift to the $1^{st}$ row of the entries $[e_{q-1}(p), e_0(p), e_1(p), \ldots, e_{q-2}(p)]$, and the $1^{st}$ row of the entries $[e_{q-1}(p), e_0(p), e_1(p), \ldots,$ $e_{q-2}(p)$] can be obtained by performing a left circular shift to the $2^{nd}$ row of the entries [$e_{q-2}(p), e_{q-1}(p), e_0(p), \ldots, e_{q-3}(p)$]. In another aspect, the entries $e_0(p)$–$e_{q-1}(p)$ in the sub-matrix $Q_p$ are down circular shifted column-by-column.

In accordance with another embodiment in FIG. 6, the sub-matrix $Q_p$, for example, is a left (or up) circulant matrix. The entries $e_0(p)$–$e_{q-1}(p)$ in the sub-matrix $Q_p$ are left circular shifted row-by-row. In another aspect, the entries $e_0(p)$–$e_{q-1}(p)$ in the sub-matrix $Q_p$ are up circular shifted column-by-column.

It should be noted that in the embodiments above, each of the sub-matrices $Q_0, Q_1, \ldots, Q_{m-1}$ can be any type of circulant matrix, such as a zero matrix (in which all of the entries are value "0"), an identity matrix, a matrix in which all of the entries are value "1," an identity matrix with specific shift values, or a circulant matrix with multiple one. The sub-matrices $Q_0, Q_1, \ldots, Q_{m-1}$ can have different quantities of value "1," such as 0, q, 2×q, ..., or q×q.

In such a configuration, column-weights of the columns of the entries (i.e., quantities of value "1" in the columns) in the double quasi-cyclic matrix DQC are equal to each other, row-weights of the rows of the entries (i.e., quantities of value "1" in the rows) in the double quasi-cyclic matrix DQC are equal to each other, and the column-weights of the columns of the entries in the double quasi-cyclic matrix are equal to the row-weights of the rows of the entries in the double quasi-cyclic matrix DQC.

Additionally, the $1^{st}$ column of the sub-matrices in the double quasi-cyclic matrix DQC can be obtained by performing a down (or up) circular shift to the $0^{th}$ column of the sub-matrices in the double quasi-cyclic matrix DQC with a shift value being 1, the $2^{nd}$ column of the sub-matrices in the double quasi-cyclic matrix DQC can be obtained by performing a down (or up) circular shift to the $0^{th}$ column of the sub-matrices in the double quasi-cyclic matrix DQC with a shift value being 2, and the $m-1^{th}$ column of the sub-matrices in the double quasi-cyclic matrix DQC can be obtained by performing a down (or up) circular shift to the $0^{th}$ column of the sub-matrices in the double quasi-cyclic matrix DQC with a shift value being m−1. That is, any column of the sub-matrices in the double quasi-cyclic matrix DQC can be obtained or derived by the $0^{th}$ column of the sub-matrices in the double quasi-cyclic matrix DQC. Similarly, any row of the sub-matrices in the double quasi-cyclic matrix DQC can be obtained or derived by the $0^{th}$ row of the sub-matrices in the double quasi-cyclic matrix DQC.

On the other hand, in each of the sub-matrices, the $1^{st}$ column of the entries can be obtained by performing a down (or up) circular shift to the $0^{th}$ column of the entries with a shift value being 1, the $2^{nd}$ column of the entries to can be obtained by performing a down (or up) circular shift to the $0^{th}$ column of the entries with a shift value being 2, and the $m-1^{th}$ column of the entries can be obtained by performing a down (or up) circular shift to the $0^{th}$ column of the entries with a shift value being m−1. That is, in each of the sub-matrices, any column of the entries can be obtained or derived by the $0^{th}$ column of the entries. Similarly, any row of the entries can be obtained or derived by the $0^{th}$ row of the entries. Therefore, any column of the sub-matrices in the double quasi-cyclic matrix DQC can be derived by the $0^{th}$ columns of the entries of all the $0^{th}$ column of the sub-matrices in the double quasi-cyclic matrix DQC.

In one embodiment, the parity-check matrix H has n×q columns of the entries and m×q rows of the entries. The double quasi-cyclic matrix DQC has m columns of sub-matrices and m rows of sub-matrices. Each of the sub-matrices $P_{0,0}$–$P_{m-1,n-1}$ has q columns of the entries and q rows of the entries. The entries in the double quasi-cyclic matrix DQC can be presented by the following equation:

$$DQC[((i \pm x) \bmod m) \times q + ((j \pm y) \bmod q)][x \times q + y] = DQC[i \times q + j][0] \quad \text{EQ1.}$$

In the equation EQ1 above, i, j, x, y are integers, $0 \leq i < m$, $0 \leq j < q$, $0 \leq x < m$, and $0 \leq y < q$. The equation EQ1 presents a relationship between the $0^{th}$ column of the entries in the double quasi-cyclic matrix DQC and the $(x \times q + y)^{th}$ column of the entries in the double quasi-cyclic matrix DQC.

In the equation EQ1, the former operand "±" is decided by the double quasi-cyclic matrix DQC being a right circulant matrix (as shown in FIG. 3) or being a left circulant matrix (as shown in FIG. 4). The latter operand "±" is decided by the sub-matrices $P_{0,x}$–$P_{m-1,x+m-1}$ in the double quasi-cyclic matrix DQC being right circulant matrices (as shown in FIG. 5) or being left circulant matrices (as shown in FIG. 6).

For example, in the case where the double quasi-cyclic matrix DQC is a right circulant matrix, and the sub-matrices $P_{0,x}$–$P_{m-1,x+m-1}$ in the double quasi-cyclic matrix DQC are right circulant matrices, the equation EQ1 can be presented as follows:

$$DQC[((i+x) \bmod m) \times q + ((j+y) \bmod q)][x \times q + y] = DQC[i \times q + j][0].$$

In the case where the double quasi-cyclic matrix DQC is a left circulant matrix, and the sub-matrices $P_{0,x}$–$P_{m-1,x+m-1}$ in the double quasi-cyclic matrix DQC are right circulant matrices, the equation EQ1 can be presented as follows:

$$DQC[((i-x) \bmod m) \times q + ((j-y) \bmod q)][x \times q + y] = DQC[i \times q + j][0].$$

In the case where the double quasi-cyclic matrix DQC is a right circulant matrix, and the sub-matrices $P_{0,x}$–$P_{m-1,x+m-1}$ in the double quasi-cyclic matrix DQC are left circulant matrices, the equation EQ1 can be presented as follows:

$$DQC[((i+x) \bmod m) \times q + ((j-y) \bmod q)][x \times q + y] = DQC[i \times q + j][0].$$

In the case where the double quasi-cyclic matrix DQC is a left circulant matrix, and the sub-matrices $P_{0,x}$–$P_{m-1,x+m-1}$ in the double quasi-cyclic matrix DQC are left circulant matrices, the equation EQ1 can be presented as follows:

$$DQC[((i-x) \bmod m) \times q + ((j-y) \bmod q)][x \times q + y] = DQC[i \times q + j][0].$$

To facilitate the description to follow, reference is made to FIG. 7.

FIG. 7 is a diagram illustrating the double quasi-cyclic matrix DQC in accordance with still another embodiment of the present disclosure. In FIG. 7, the symbols "●" in the double quasi-cyclic matrix DQC indicate value "1," and the other portion in the double quasi-cyclic matrix DQC is value "0." In this embodiment, the double quasi-cyclic matrix DQC is a right circulant matrix, and the sub-matrices $Q_0, Q_1, \ldots, Q_{m-1}$ in the double quasi-cyclic matrix DQC are right circulant matrices. Each of the sub-matrices $Q_0, Q_1, \ldots, Q_{m-1}$ in the double quasi-cyclic matrix DQC can be a q×q square matrix (e.g., q=7). The sub-matrix $Q_0$ can be an identity matrix with a right shift value of 4. The sub-matrix $Q_1$ can be a zero matrix. The sub-matrix $Q_2$ can be an identity matrix with a right shift value of 2. The sub-matrix $Q_3$ can be an identity matrix with a right shift value of 0. The sub-matrix $Q_{m-1}$ can be a zero matrix.

In the case where x is 3, and y is 4, the function x×q+y is 25, and the entries of the $25^{th}$ column of the double quasi-cyclic matrix DQC can be derived by the $0^{th}$ column of the double quasi-cyclic matrix DQC as presented in the following equation:

DQC[((i+3)mod m)×7+((j+4)mod 7)][3×7+4]=DQC [i×7+j][0].

In the equation above, i and j are integers, $0 \leq i < m$, and $0 \leq j < 7$. The equation presents a relationship between the $0^{th}$ column of the entries in the double quasi-cyclic matrix DQC and the $25^{th}$ column of the entries in the double quasi-cyclic matrix DQC.

In the following paragraphs, an encoding operation and a decoding operation of the processor 100 will be described.

In one embodiment, the processor 100 can be a low density parity check (LDPC) encoder. The input signal can be a message. The processing module 110 can utilize a generator matrix G corresponding to the parity-check matrix H to encode the message, and generate an LDPC codeword to serve as the to output signal. In such an encoding operation, an inverse matrix $DQC^{-1}$ of the double quasi-cyclic matrix DQC used to calculate parity bits of the LDPC codeword can be prepared beforehand. Since the inverse matrix $DQC^{-1}$ is also a circulant matrix having a plurality of sub-matrices circular shifted row-by-row and each sub-matrix is a circulant matrix having a plurality entries circular shifted row-by-row, it is necessary to store only a $0^{th}$ row of the entries of the inverse matrix $DQC^{-1}$ in the processing module 110, and the inverse matrix $DQC^{-1}$ may be realized using simply shift registers and XOR gates. Thus, memory usage can be minimized and the complexity of the hardware of the processing module 110 can be reduced. Moreover, the duration involved in calculating the parity bits through the inverse matrix $DQC^{-1}$ is a linear time, and therefore, the processing module 110 can have a high encoding speed.

Figure 8:
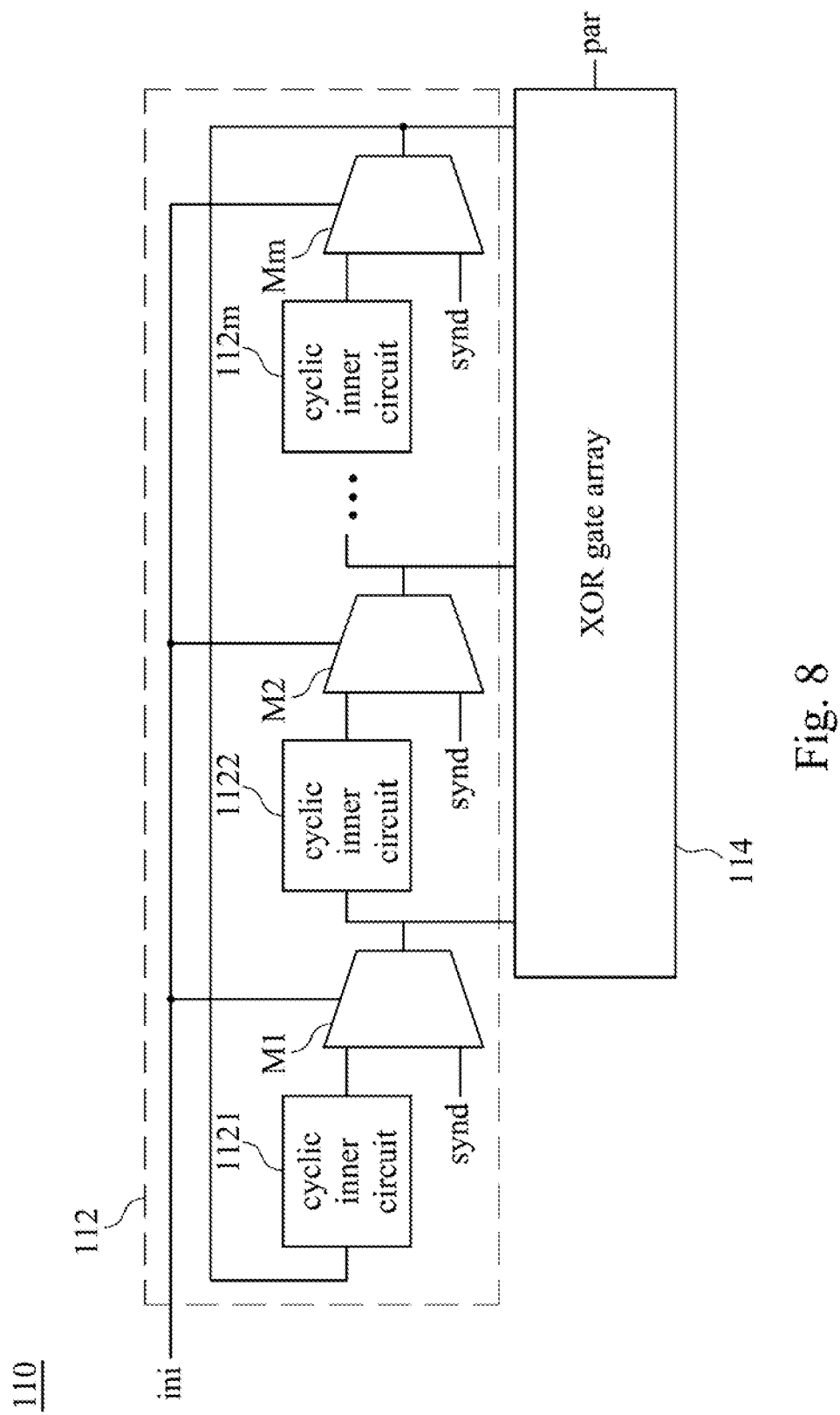
FIG. 8 is a schematic diagram of a processing module in accordance with one embodiment of the present disclosure.
Figure 9:
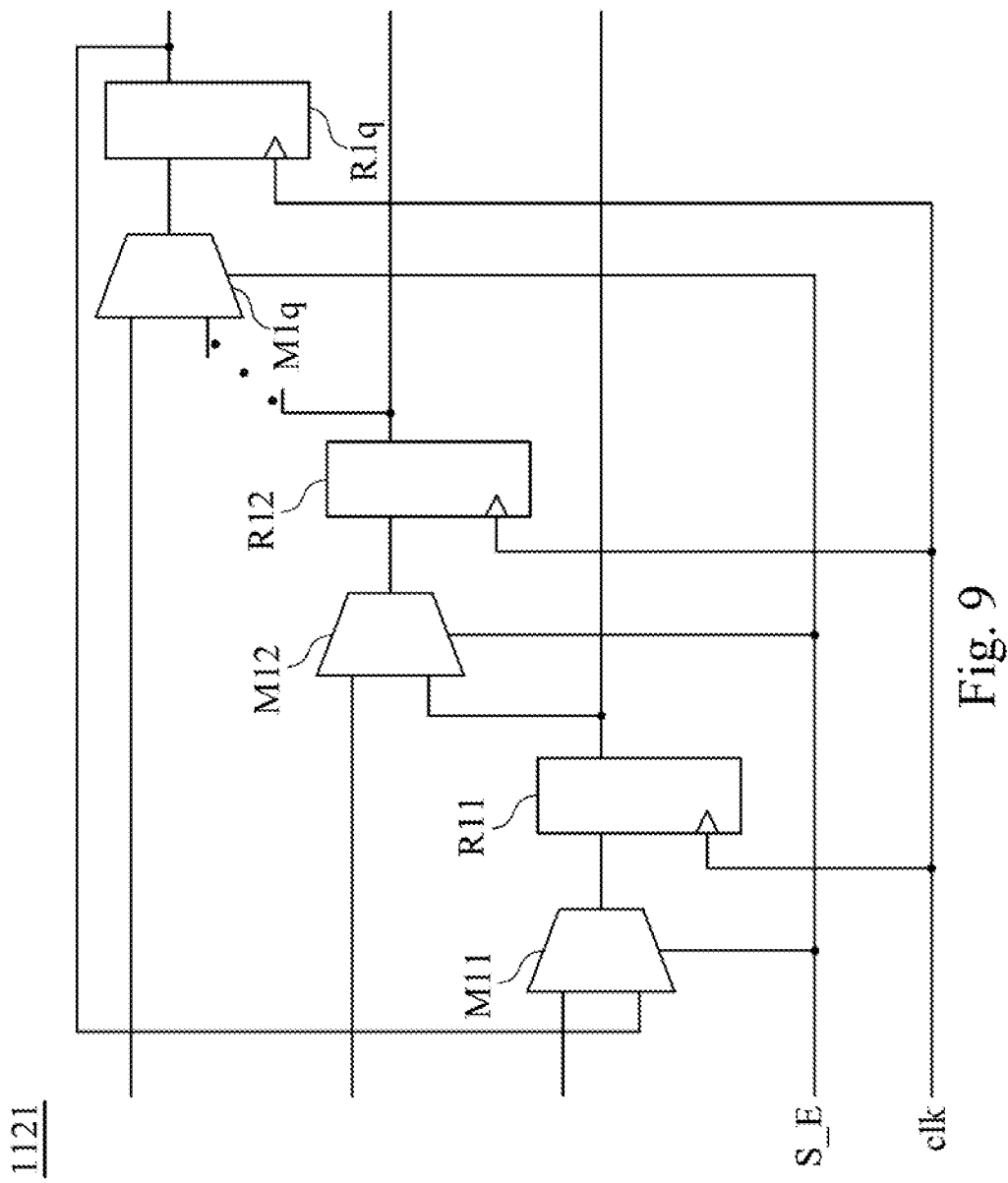
FIG. 9 is a schematic diagram of a cyclic inner circuit in accordance with one embodiment of the present disclosure.

Reference is now made to FIG. 8 and FIG. 9, in which FIG. 8 is a schematic diagram of the processing module 110 in accordance with one embodiment of the present disclosure, and FIG. 9 is a schematic diagram of a cyclic inner circuit 1121 in accordance with one embodiment of the present disclosure. In this embodiment, the processing module 110 (for example, used to perform an encoding operation) includes a cyclic outer circuit 112 and an XOR gate array 114. The cyclic outer circuit 112 includes a plurality of second multiplexers M1-Mm and a plurality of cyclic inner circuits 1121-112m. The cyclic inner circuits 1121-112m separately include a plurality of shift registers R11-Rmq and a plurality of first multiplexers M11-Mmq. For example, the cyclic inner circuit 1121 includes the shift registers R11-R1q and the first multiplexers M11-M1q, and the cyclic inner circuit 112m includes the shift registers Rm1-Rmq and the first multiplexers Mm1-Mmq.

In this embodiment, the shift registers R11-Rmq are configured to receive a clock signal clk, and to store information corresponding to the input signal (e.g., the information can be a syndrome vector). The first multiplexers M11-Mmq are configured to receive a shift-enable signal S_E and to quasi-cycle (e.g., right or left circular shift) the information stored in the shift registers R11-Rmq according to the shift-enable signal S_E.

The second multiplexers M1-Mm are configured to receive an initial signal ini, and to block quasi-cycle the information stored in the shift registers R11-Rmq (e.g., to shift the information stored in the shift registers R11-R1q to shift registers R21-R2q, or to shift the information stored in the shift registers R21-R2q to shift registers R31-R3q) and to output the information stored in the shift registers R11-Rmq of the cyclic inner circuits 1121-112m according to the initial signal ini.

The XOR gate array 114 includes a plurality of XOR gates. The XOR gates are disposed corresponding to the $0^{th}$ column of the entities of the inverse matrix $DQC^{-1}$. The XOR gate array 114 is configured to receive the information outputted from the second multiplexers M1-Mm, and to output a plurality of parity bits par of the LDPC codeword according to the information outputted from the second multiplexers M1-Mm and the inverse matrix $DQC^{-1}$. In other words, during each period of the clock signal clk, the cyclic outer circuit 112 can quasi-cyclic and block quasi-cyclic the information stored in the shift registers R11-Rmq, and output the information stored in the shift registers R11-Rmq sequentially to the XOR gate array 114, so as to generate parity bits par of the LDPC codeword.

In this embodiment, each of the second multiplexers M1-Mm includes a first input end, a second input end, a control end, and an output end. The first input end of each of the second multiplexers M1-Mm is electrically connected to an output end of a corresponding cyclic inner circuit of the cyclic inner circuits 1121-112m. For example, the first input end of the second multiplexer M1 is electrically connected to the output end of the cyclic inner circuits 1121, and the first input end of the second multiplexer M2 is electrically connected to the output end of the cyclic inner circuits 1122. The output end of each of the second multiplexers M1-Mm is electrically connected to the XOR gate array 114 and an input end of another corresponding cyclic inner circuit of the cyclic inner circuits 1121-112m. For example, the output end of the second multiplexers M1 is electrically connected to an input end of the cyclic inner circuits 1122, and the output end of the second multiplexers M2 is electrically connected to an input end of the cyclic inner circuits 1123. The control end of each of the second multiplexers M1-Mm is configured to receive the initial signal ini.

Additionally, the second input end of each of the second multiplexers M1-Mm can receive a syndrome vector synd. In such a configuration, an initial syndrome vector of the cyclic outer circuit 112 can be controlled through the initial signal ini.

It should be noted that quantities of the cyclic outer circuit 112 and the XOR gate array 114 are not limited to 1. That is, in one embodiment, one or more information are circular shifted to generate one or more parity bits in each period of the clock signal clk.

On the other hand, in one embodiment, the first multiplexers and the second multiplexers can be integrated, and quantities of the first multiplexers and the second multiplexers can be varied on the basis of actual requirements, with the quantities thereof not being limited to the embodiment described above.

Moreover, it will be apparent to those of skilled in the art that the cyclic outer circuit 112 and the cyclic inner circuit 1121-112m can be designed to perform multiple times (e.g., multiple bits) of circular shift to generate multiple parity bits in each of the periods of the clock signal clk.

It should be noted that in the processing module 110 shown in FIG. 8, the parity-check matrix H can be row interchanged without essentially affecting the encoding result the processing module 110 generated. That is, after the parity-check matrix H is row interchanged (e.g., the $0^{th}$ row of the entities of the parity-check matrix H and the $3^{rd}$ row of the entities of the parity-check matrix H are interchanged), the output signal generated by the processing module 110 is essentially the same as the output signal before the parity-check matrix H row interchanged.

In another embodiment, the processor 100 can be a low density parity check (LDPC) decoder. The input signal can be an LDPC codeword. The processing module 110 can decode (and correct) the LDPC codeword through the parity-check matrix H (e.g., through multiplying the parity-check matrix H to the LDPC codeword), and generate a decoded (and corrected) message to serve as the output signal. The double quasi-cyclic matrix DQC can be used to decode the parity bits of the LDPC codeword. Similarly, it is necessary to store only a $0^{th}$ row of the entries of the double quasi-cyclic matrix DQC in the to processing module 110, and therefore, memory usage can be minimized and the complexity of the hardware of the processing module 110 can be simplified.

In accordance with one embodiment of the invention, mathematically, the parity-check matrix H can be divided into two portions by performing row interchange, in which one of the portions is the double quasi-cyclic matrix DQC having the sub-matrices arranged regularly, and the other one of the portions is a non-double quasi-cyclic matrix having the sub-matrices arranged arbitrarily. The parity-check matrix H can be presented as H=[$H_i$ $H_p$], in which matrix $H_i$ is the non-double quasi-cyclic matrix, and the matrix $H_p$ is the double quasi-cyclic matrix DQC. According to the characteristics of the double quasi-cyclic matrix, the invert matrix $H_i^{-1}$ of the double quasi-cyclic matrix can also have the double quasi-cyclic characteristic (that is, the invert matrix $H_i^{-1}$ is a circulant matrix having a plurality of sub-matrices circular shifted row-by-row and each sub-matrix is a circulant matrix having a plurality entries circular shifted row-by-row).

Corresponding to the parity-check matrix H, an LDPC legal codeword c can be divided into two portions c=[I P], in which I is an information code, and P is a parity check code (i.e., parity bits). Syndrome values can be obtained by multiplying the parity-check matrix H to the LDPC legal codeword c, are zero. That is, $H_iI+H_pP=0$. The parity check code P can be presented as P=$H_p^{-1}H_iI$, in which $H_iI$ is a portion of the syndrome values.

In one embodiment, the syndrome vector synd provided to the second input end of the second multiplexer M1-Mm is $H_iI$. In such a manner, the multiplication operation corresponding to the invert matrix $H_p^{-1}$ can be performed by using the cyclic inner circuit 1121-112m, cyclic outer circuit 112, and XOR gate array 114, such that the complexity of the hardware of the processing module can be reduced.

Figure 10:
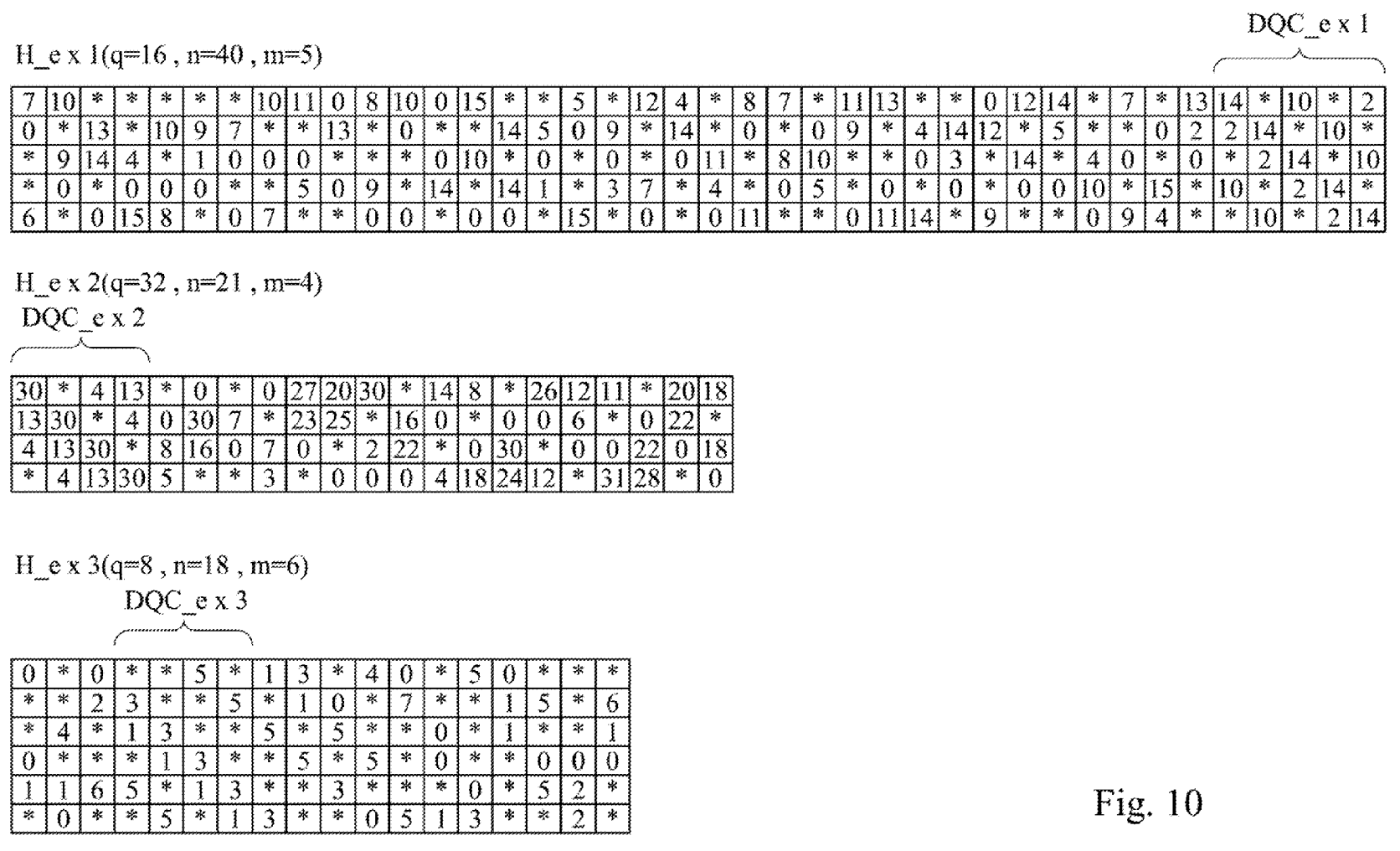

FIG. 10 is a diagram illustrating three parity-check matrices H_ex1, H_ex2, H_ex3 in accordance with one embodiment of the present disclosure. Each grid in the parity-check matrices indicates a sub-matrix, and the number in each grid indicates a shift value of the sub-matrix. For example, in this embodiment, an identity matrix is presented as a grid with a number 0, and an identity matrix with a left or right shift value of 1 is presented as a grid with a number 1. In addition, in this embodiment, a zero matrix is presented as a grid with a symbol "*". The parity-check matrices H_ex1, H_ex2, H_ex3 respectively have double quasi-cyclic matrices DQC_ex1, DQC_ex2, DQC_ex3. The double quasi-cyclic matrices DQC_ex1, DQC_ex2, DQC_ex3 are located at different locations of the parity-check matrices H_ex1, H_ex2, H_ex3, in which the locations of the double quasi-cyclic matrices DQC_ex1, DQC_ex2, DQC_ex3 correspond to locations of parity bits of LDPC codewords. It should be noted that although the sub-matrices in non-double quasi-cyclic portions of the parity-check matrices H_ex1, H_ex2, H_ex3 are also circulant matrices in this embodiment, in practice, the sub-matrices in non-double quasi-cyclic portions of the parity-check matrices H_ex1, H_ex2, H_ex3 can be in arbitrary forms, and are not limited to the above embodiment described above.

Figure 11:
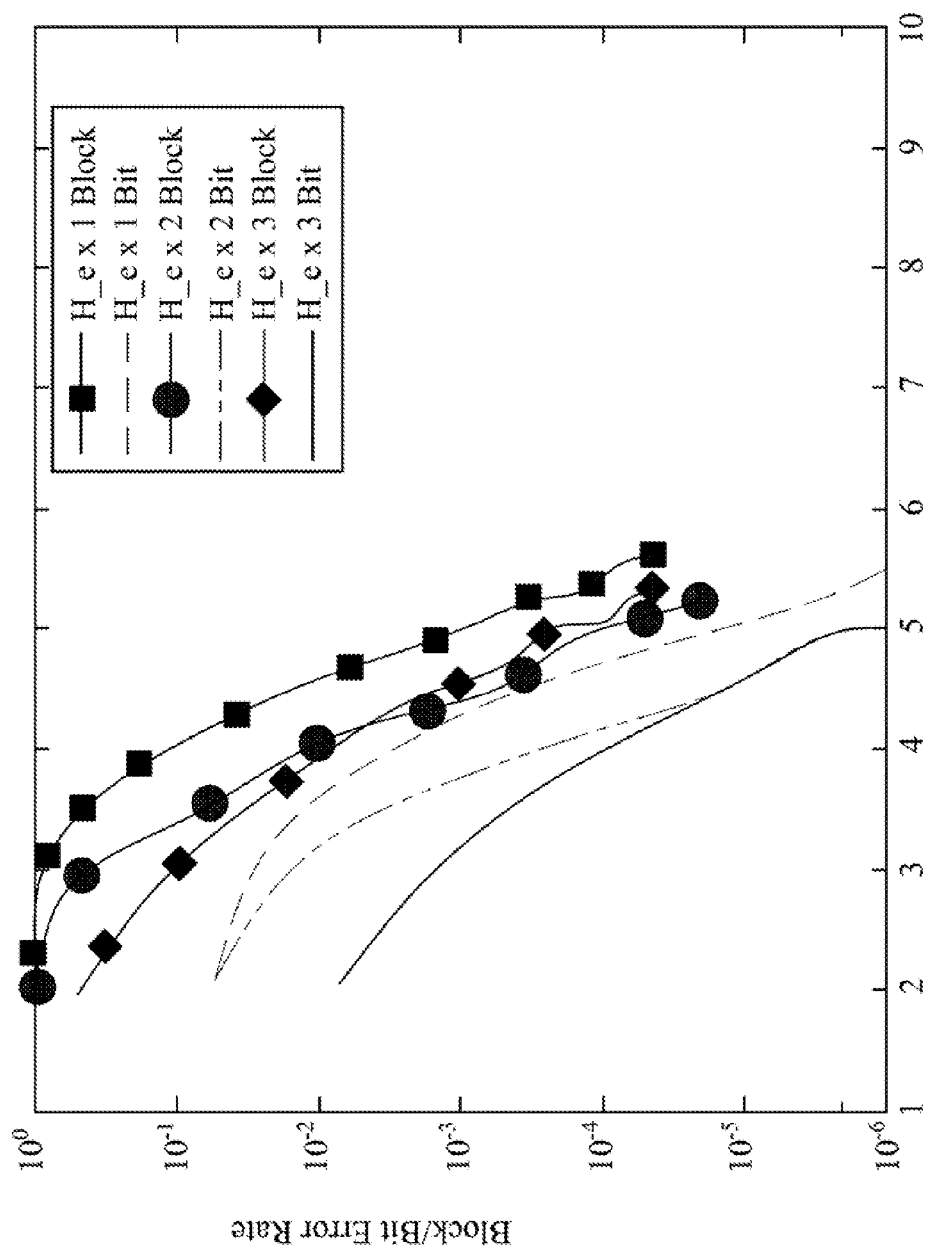
FIG. 11 is a diagram illustrating correct capacities of the three parity-check matrices in FIG. 10.

FIG. 11 is a diagram illustrating correct capacities of the parity-check matrices H_ex1, H_ex2, H_ex3 in FIG. 10. By separately utilizing the parity-check matrices H_ex1, H_ex2, H_ex3 respectively having double to quasi-cyclic matrices DQC_ex1, DQC_ex2, DQC_ex3 to perform encoding/decoding operation, the bit error rate in each case is low enough. Therefore, by utilizing each of the parity-check matrices H_ex1, H_ex2, H_ex3 to perform an encoding/decoding operation, high level correct capacities can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A processor corresponding to a double quasi-cyclic low density parity check (DQC-LDPC) code, wherein the processor comprises:
   an input end configured to receive an input signal:
   an output end configured to output an output signal: and
   a processing module configured to process the input signal to generate the output signal corresponding to a parity-check matrix of the DQC-LDPC code,
   wherein the parity-check matrix comprises a double quasi-cyclic (DQC) matrix, the double quasi-cyclic matrix comprises a plurality of sub-matrices, the sub-matrices are arranged in an array, each sub-matrix comprises a plurality of entries, each sub-matrix is a circulant matrix having the entries circular shifted pow-by-row, and the double quasi-cyclic matrix is a circulant matrix having the submatrices ircular shifted row-by-row:
   wherein the parity-check matrix has n×q columns of the entries and m×q rows of the entries, the double quasi-cyclic matrix has m columns of sub-matrices and m rows of sub-matrices, each of the sub-matrices has q columns of the entries and q rows of the entries, the double quasi-cyclic matrix is presented as DQC in an equation below, and the entries in the double quasi-cyclic matrix are conformed to the equation:

$$DQC[((i\pm x) \bmod m) \times q+((j \pm y) \bmod q)][x \times q \pm y] = DQC[i \times q \pm j][0],$$

where i, j, x, y are integers, 0≤i<m, 0≤j<q, 0≤x<m, and 0≤y<q.

2. The processor as claimed in claim 1, wherein the sub-matrices are right circulant matrices having the sub-matrices circular right shifted row-by-row.

3. The processor as claimed in claim 1, wherein the sub-matrices are left circulant matrices having the sub-matrices circular left shifted row-by-row.

4. The processor as claimed in claim 1, wherein the double quasi-cyclic matrix corresponds to the output signal or to a plurality of parity bits of the output signal.

5. The processor as claimed in claim 1, wherein the double quasi-cyclic matrix is a square matrix.

6. The processor as claimed in claim 1, wherein column-weights of columns of the entries in the double quasi-cyclic matrix are equal to each other, row eights of rows of the entries in the double quasi-cyclic matrix are equal to each other, and the column-weights of the columns of the entries in the double quasi-cyclic matrix are equal to the row-weights of the rows of the entries in the double quasi-cyclic matrix.

7. The processor as claimed in claim 1, wherein the input signal is a message, and the processing module is configured to encode the input signal to output a low density parity check (LDPC) codeword serving as the output signal.

8. The processor as claimed in claim 7, wherein the processing module comprises:

a cyclic outer circuit comprising:
  a plurality of cyclic inner circuits, wherein each cyclic inner circuit comprises:
    a plurality of shift registers configured to receive a clock signal and store an information; and
    a plurality of first multiplexers configured to receive a shift-enable signal and to quasi-cycle the information stored in the shift registers according to the shift-enable signal; and
  a plurality of second multiplexers configured to receive an initial signal, and to block quasi-cycle the information stored in the shift registers and to output the information stored in the shift registers of the cyclic inner circuits according to the initial signal; and
  an XOR gate array comprising a plurality of XOR gates, ein the XOR gates are disposed corresponding to an inverse matrix of the double quasi-cyclic matrix, and the XOR gate array is configured to receive the information outputted from the second multiplexers and to output a plurality of parity bits of the LPC codeword according to the information outputted from the second multiplexers and the inverse matrix of the double quasi-cyclic matrix.

9. The processor as claimed in claim 8, wherein after the parity-check matrix is roar interchanged, the output signal generated by the processing module is essentially the same as the output signal before the parity-check matrix is row interchanged.

10. The processor as claimed in claim 8, wherein each of the second multiplexers comprises first input end, a second input end, a control end, and an output end, the first input end of each of the second multiplexers is electrically connected to a corresponding cyclic inner circuit of the cyclic inner circuits, the output end of each of the second multiplexers is electrically connected to the XOR gate array and another corresponding cyclic inner circuit of the cyclic inner circuits, and the control end of each of the second multiplexers is configured to receive the initial signal.

11. The processor as claimed in claim 10, wherein the second input ends of the second multiplexers are configured to receive a syndrome vector.

12. The processor as claimed in claim 1, wherein the input signal an DPC codeword, and the processing module is configured to decode the input signal to output a decoded message serving as the output signal.

13. The processor as claimed in claim 1, wherein the entries inside each of the sub-matrices are right circular matrices having the entries right shifted row-by-row.

14. The processor as claimed in claim 1, wherein the entries inside each of the sub-matrices are left circulant matrices having the entries left shifted row-by-row.

\* \* \* \* \*